US008653887B2

(12) United States Patent
Hellberg (10) Patent No.: US 8,653,887 B2
(45) Date of Patent: Feb. 18, 2014

(54) METHOD AND ARRANGEMENT IN A MOBILE COMMUNICATION SYSTEM

(75) Inventor: Richard Hellberg, Huddinge (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 50 days.

(21) Appl. No.: 13/388,536

(22) PCT Filed: Sep. 15, 2009

(86) PCT No.: PCT/SE2009/051019
§ 371 (c)(1),
(2), (4) Date: Feb. 2, 2012

(87) PCT Pub. No.: WO2011/034471
PCT Pub. Date: Mar. 24, 2011

(65) Prior Publication Data
US 2012/0126886 A1   May 24, 2012

(51) Int. Cl.
H03F 1/14 (2006.01)
(52) U.S. Cl.
USPC .................. 330/51; 330/295; 330/124 R
(58) Field of Classification Search
USPC .............................. 330/51, 124 R, 295
See application file for complete search history.

(56) References Cited

U.S. PATENT DOCUMENTS

| 6,255,906 | B1 | 7/2001 | Eidson et al. | |
|---|---|---|---|---|
| 7,444,124 | B1 | 10/2008 | Loeb et al. | |
| 7,649,411 | B2* | 1/2010 | Aoki et al. | 330/51 |
| 2002/0084844 | A1 | 7/2002 | Monroe | |
| 2002/0097087 | A1* | 7/2002 | Petz et al. | 330/124 R |
| 2002/0149428 | A1* | 10/2002 | Toncich et al. | 330/302 |
| 2005/0030094 | A1 | 2/2005 | Conrad et al. | |

FOREIGN PATENT DOCUMENTS

EP    1 330 021 A2    7/2003

OTHER PUBLICATIONS

Hans Roder; "Analysis of Load-Impedance Modulation" Proceedings of the I.R.E., Jun. 1939, pp. 386-395.
William Parker; "A Unique Method of Modulation for High-Fidelity Television Transmitters" Proceedings of the Institute of Radio Engineers, vol. 26, No. 8, Aug. 1938, pp. 946-962.
International Search Report, PCT Application No. PCT/SE2009/051019, May 24, 2010.
Written Opinion of the International Searching Authority, PCT Application No. PCT/SE2009/051019, May 24, 2010.
International Preliminary Report on Patentability, PCT Application No. PCT/SE2009/051019, Dec. 19, 2011.
Shirvani et al., "A CMOS RF Power Amplifier With Parallel Amplification for Efficiency Power Control", *IEEE Journal of Solid-State Circuits*, vol. 37, No. 6, Jun. 2002, pp. 684-693.
European Search Report Corresponding to European Application No. 09 84 9595; Dated: Jan. 31, 2013; 6 Pages.

* cited by examiner

*Primary Examiner* — Robert Pascal
*Assistant Examiner* — Khiem Nguyen
(74) *Attorney, Agent, or Firm* — Myers Bigel Sibley & Sajovec, P.A.

(57) ABSTRACT

The present invention relates to an amplifier circuit where a load modulation is applied to a segmented amplifier. This will reduce the shunt loss since the loss of a segmented amplifier is reduced by allowing each amplifier segment or combination of segments to operate to their full output power capacity, rather than limited to a lower output power which results in a higher shunt loss. Hence, operation to full capacity before adding more segments is made possible by dynamically modulating the load.

20 Claims, 13 Drawing Sheets

METHOD AND ARRANGEMENT IN A MOBILE COMMUNICATION SYSTEM

CROSS REFERENCE TO RELATED APPLICATIONS

This application is a 35 U.S.C. §371 national stage application of PCT International Application No. PCT/SE2009/051019, filed on 15 Sep. 2009, the disclosure and content of which is incorporated by reference herein in its entirety. The above-referenced PCT International Application was published in the English language as International Publication No. WO 2011/034471 A1 on 24 Mar. 2011.

TECHNICAL FIELD

The present invention relates to a method and an arrangement in a mobile communications system, and in particular to a solution for increasing the efficiency of amplifiers in such a system.

BACKGROUND

Transmitters in base stations and terminals for mobile telephony as well as transmitters for broadcast and other wireless systems all need power amplifiers (PA) to amplify the radio frequency (RF) signal to the antenna. Often, this PA needs to be very efficient to increase battery time, decrease the energy cost, and minimize cooling needs.

Traditional class B and AB PAs usually operate with constant load and constant supply voltage. The "optimal load" (Ropt) is the load that gives the highest output power under allowed operating conditions. Class B or AB operation means that the transistor current pulses approximately have the shape of half-wave rectified sine waves. The current pulses have largely the same shape at all amplitudes, and both the RF output current and the DC supply current, and hence DC power, are therefore approximately proportional to their height. This is also the case with the RF output voltage. The RF output power is proportional to the RF output current squared, which means that the DC to RF efficiency is approximately proportional to the RF output voltage amplitude. Due to this proportionality, the average efficiency for a class B amplifier, outputting a signal whose average signal level is well below the maximum (peak) level, is low compared to the efficiency at maximum output.

Load Modulation (LM) or Dynamic Load Matching (DLM) is a method to increase an amplifier's efficiency for amplitude modulated signals by having a matching network that can be varied at signal envelope speeds. By dynamically re-matching the load to the RF transistor the average RF current can be reduced. The average efficiency is increased by having the matching network transform the load resistance into a high resistance at the transistor output node at low output levels and a lower resistance equal to the optimal class B resistance Ropt at maximum output level. This lowers the RF output current at all output levels except the maximum, while producing the same RF voltage and current in the load. The RF voltage at the transistor output is at the same time increased. Reduced RF output current is translated into reduced DC current if some efficient operation class, e.g. class B, is used.

Segmentation of the amplifier into several smaller amplifiers that are individually coupled by quarter-wave transmission lines to the output increases efficiency. Efficiency maxima at several backed of amplitudes are obtained. This is because the quarter-wave lines, which have characteristic impedance of Ropt of the transistor they are connected to, transform the load resistance into a higher resistance than Ropt at the transistor outputs. This type of amplifier then has a lower average sum of RF output currents from the transistors than a conventional amplifier. The RF voltages at the active transistors' outputs are at the same time increased. The switching in and out of amplifier segments can be done either by switches or by tuneable circuits.

Real transistors often have substantial parasitic losses that reduce the achievable efficiency. The above described efficient amplifiers reduce the average output current, which minimizes loss that can be seen as effectively in series (with the load) at the transistors' output nodes. Another type of loss mechanism can be seen as effectively in shunt (coupled from node to ground) at the output node. This loss gets worse in amplifiers using the abovementioned efficiency increasing methods since they depend upon high RF voltages at the transistors. Such shunt loss is common in practical RF power transistors so the theoretical efficiency gains of the methods are often reduced in practice.

Figure 1:
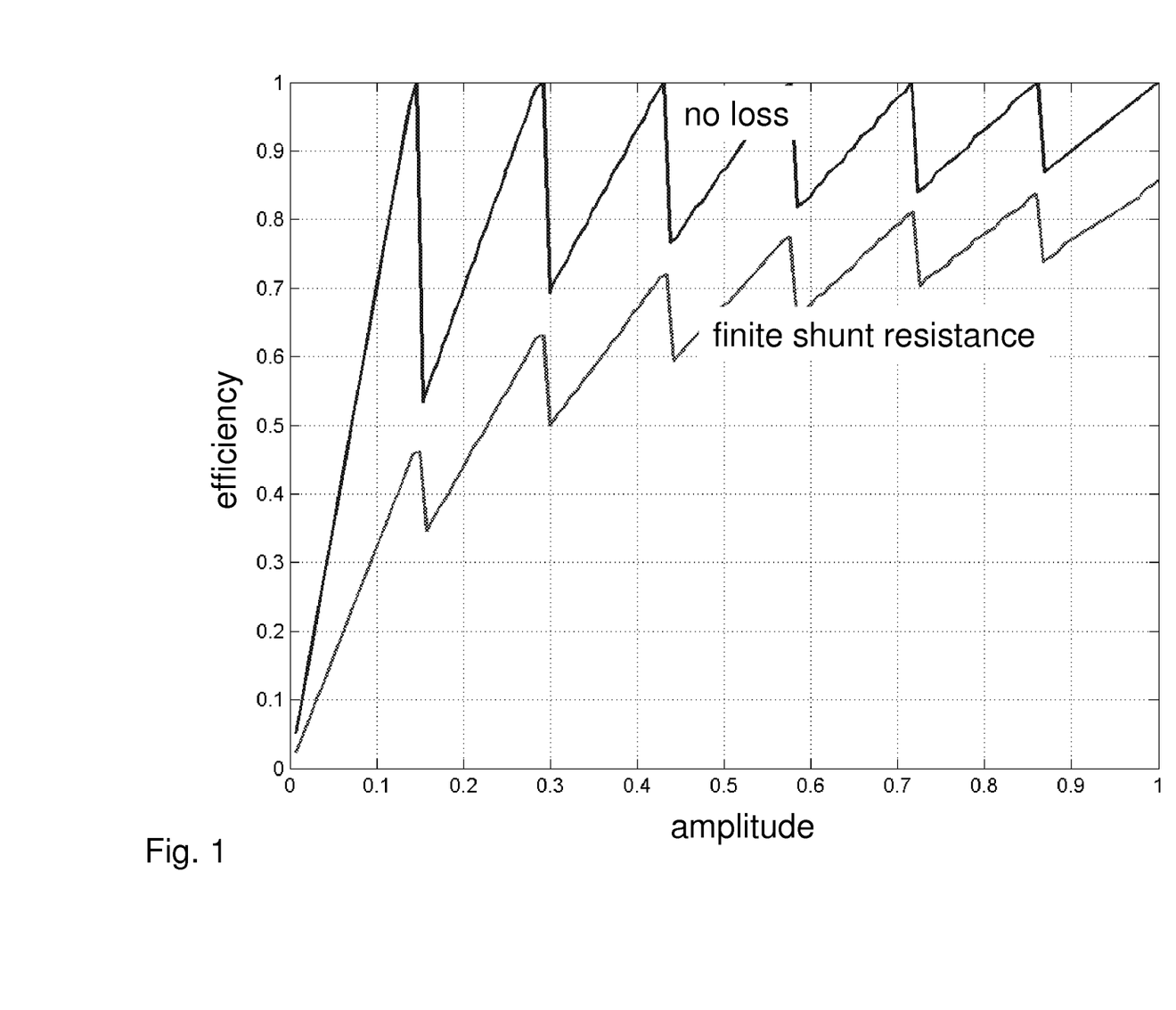
FIG. 1 illustrates the efficiency for a segmented amplifier with quarter-wave lines from each amplifier segment to the load, for no shunt loss (upper trace) and loss due to a shunt resistor (lower trace).

Segmented amplifiers with quarter-wave lines suffer from increased shunt loss due to the higher RF voltages at transistor outputs. The efficiency for a segmented (3 binary weighted segments) amplifier with quarter-wave lines from each amplifier segment to the load, for no shunt loss (upper trace) and loss due to a shunt resistor (lower trace) is shown in FIG. 1.

It can be noticed that the efficiency of segmented amplifiers is degraded by shunt loss, more for lower output amplitudes than for higher.

Figure 2:
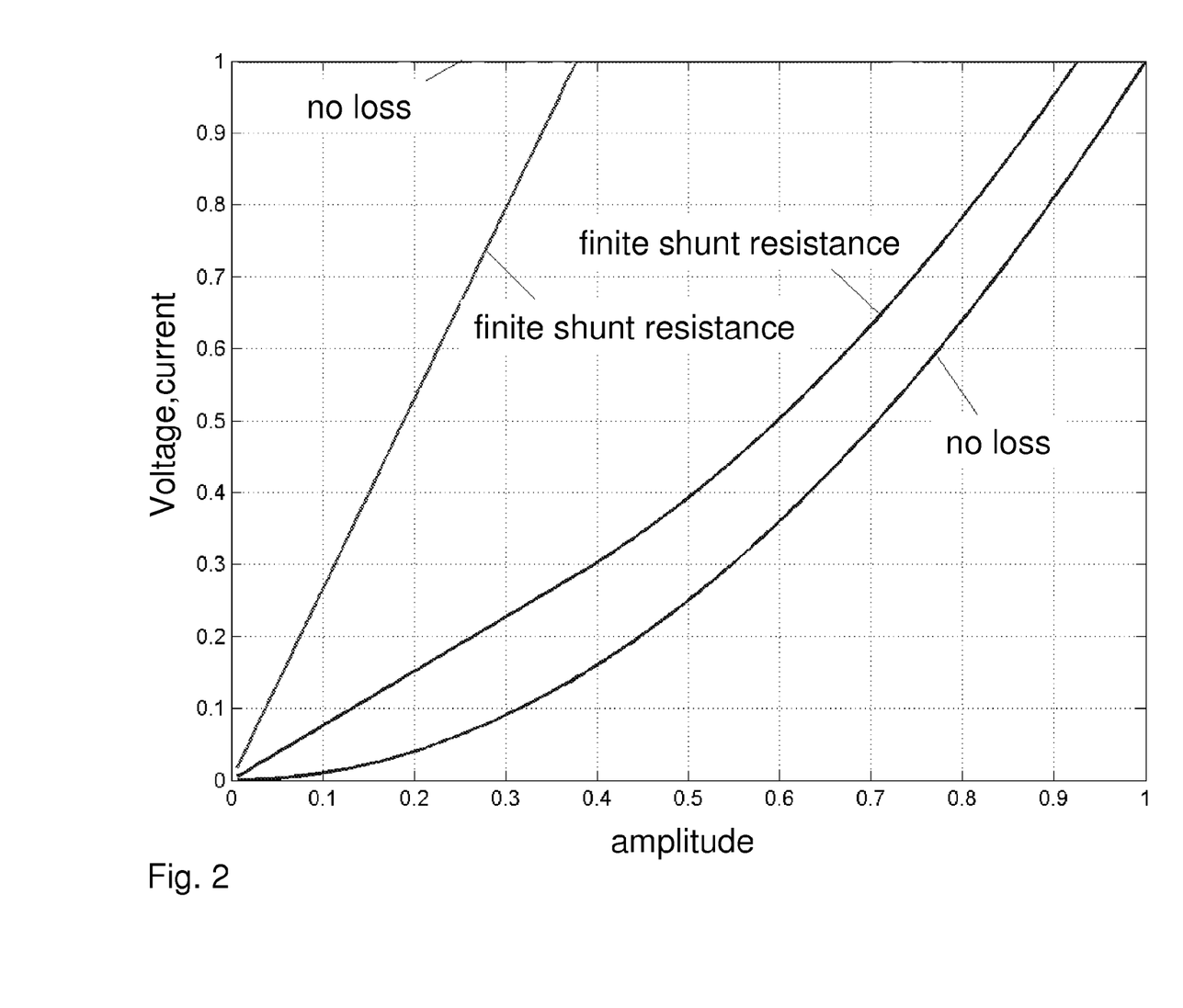
FIG. 2 illustrates voltage (upper traces) and current (lower traces) vs. output amplitude for no shunt loss and loss due to a shunt resistor of seven times the optimal load resistance.

Shunt loss at the transistor output is the most detrimental loss in Load Modulation amplifiers as well. The effect is big since this loss is proportional to the squared voltage at the transistor output node, i.e. the same voltage that is increased at all output levels as an effect of the dynamic load transformation. FIG. 2 shows the optimal output voltages and currents (normalized) for LM amplifiers with no shunt loss and loss due to a finite shunt resistance.

Figure 3:
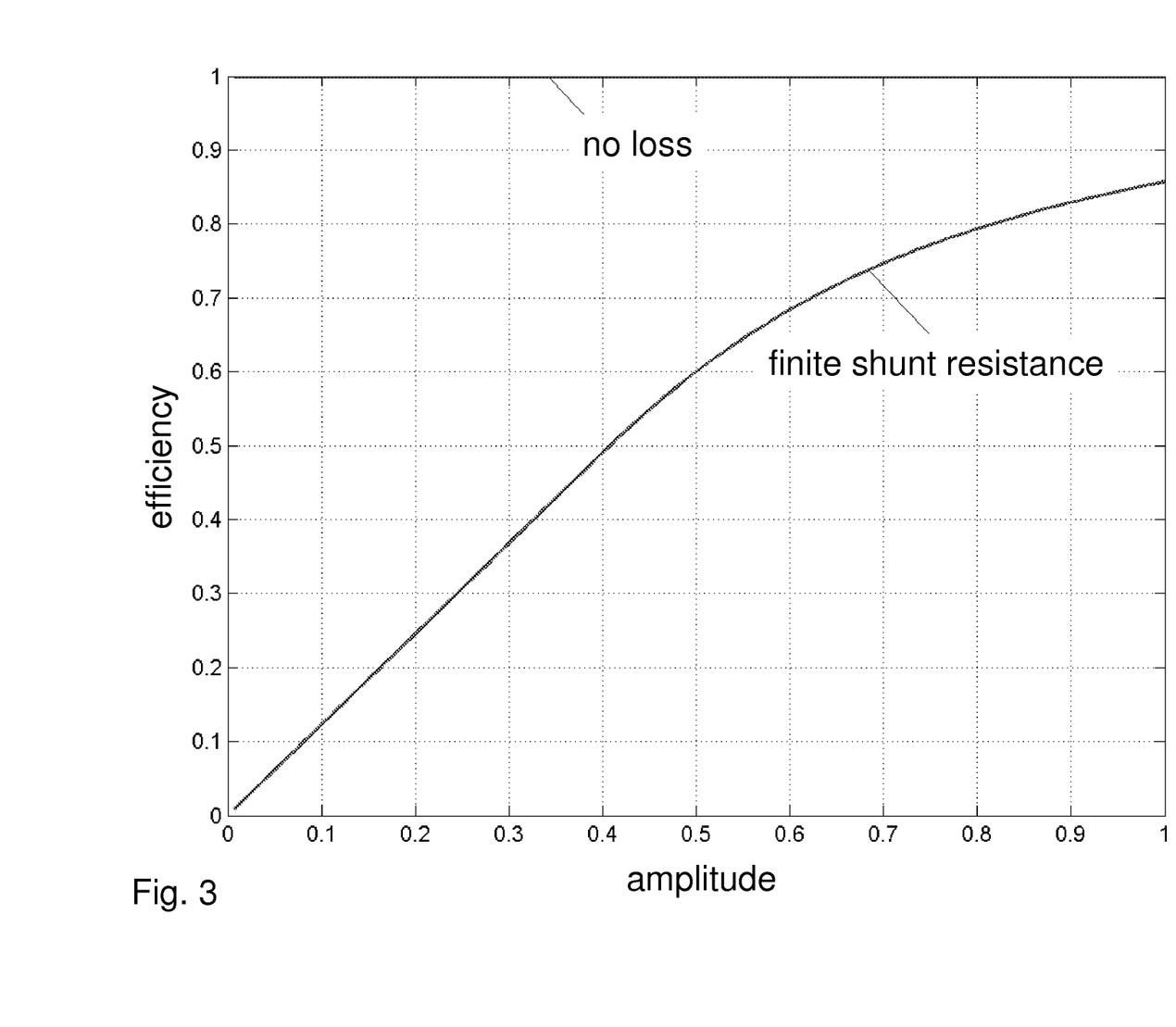
FIG. 3 illustrates the efficiency vs. output amplitude for no shunt loss (upper trace) and loss due to a shunt resistor (lower trace).

The RF current is much higher for the transistor with shunt loss, resulting in a lower efficiency. For the lower part of the amplitude range, the load is fixed at a value about the same as the shunt resistance, and the voltage is proportional to output amplitude. The resulting efficiency for the LM amplifiers with and without shunt loss is shown in FIG. 3.

Accordingly, also the LM amplifier's efficiency is degraded by shunt loss; more for lower output amplitudes than for higher output amplitudes.

SUMMARY

Thus, an objective with the present invention is to provide an amplifier with high efficiency and which is less sensitive to shunt loss.

According to a first aspect of the present invention, a method for amplifying signals with varying amplitude is provided. In the method, at least one amplifier segment of a plurality of amplifier segments is determined to be used for amplifying the signal with varying amplitude based on the amplitude of the signal to be amplified such that substantial optimal amplifier efficiency is achieved. The signal is then amplified by using the determined amplifier segments. Further, a load is applied on the amplified signal, and the load is dynamically modulated based on the amplitude of the amplified signal.

According to a second aspect of the present invention an amplifier circuit for amplifying signal with varying amplitude is provided. The amplifier circuit comprises a plurality of amplifier segments and connectors for interconnecting the plurality of amplifier segments to be used for amplifying the signal with varying amplitude. Furthermore, a logic unit for determining at least one amplifier segment of the plurality of amplifier segments to be used for amplifying the signals based on the amplitude or power level of signal. According to the present invention, the amplifier circuit comprises a load, to be applied on the amplified signal, connected to the plurality of amplifier segments, wherein the load is configured to be dynamically modulated based on the amplitude of the signal.

Thus, the objective problem is solved by the present invention by applying load modulation to a segmented amplifier. It should be noted that both the LM amplifier's efficiency and the segmented amplifier's efficiency, respectively, is degraded by shunt loss. However, the loss of a segmented amplifier is reduced by allowing each amplifier segment or combination of segments to operate to their full output power capacity, rather than limited to a lower output power by the quarter-wave lines' impedance transformation as the best prior art segmented amplifiers. Hence, operation to full capacity before adding more segments is made possible by dynamically modulating the load by using load modulation.

An advantage with the present invention is that it has potentially very high efficiency, especially for peaky signals (having e.g. a high peak to average ratio) and in backoff (at low amplitudes). In addition, it has very low sensitivity for most transistor parasitics.

Embodiments of the present invention retain the advantage of segmented amplifiers that amplifier segments not in use can be switched out of the circuit, so that their parasitic shunt resistance does not affect the remaining circuit.

A further advantage with embodiments of the present invention is that the impact of shunt resistance for each combination of amplifier segments is drastically reduced.

Thus, this makes it one of the most efficient amplifiers available. For many transistor technologies and frequencies of operation it is the most efficient amplifier if a sufficient number of segments are used.

DETAILED DESCRIPTION

The present invention will be described more fully hereinafter with reference to the accompanying drawings, in which preferred embodiments of the invention are shown. The invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like reference signs refer to like elements.

Moreover, those skilled in the art will appreciate that the control of the means and functions explained herein below may be implemented using software functioning in conjunction with a programmed microprocessor or general purpose computer, and/or using an application specific integrated circuit (ASIC). It will also be appreciated that while the current invention is primarily described in the form of methods and devices, the invention may also be embodied in a computer program product as well as a system comprising a computer processor and a memory coupled to the processor, wherein the memory is encoded with one or more programs that may perform the functions disclosed herein.

The basic idea of the present invention is to apply load modulation to a segmented amplifier. This will reduce the shunt loss since the loss of a segmented amplifier is reduced by allowing each amplifier segment or combination of segments to operate to their full output power capacity, rather than limited to a lower output power which results in a higher shunt loss. Hence, operation to full capacity before adding more segments is made possible by dynamically modulating the load.

Thus, it is first determined which amplifier segment(s) that should be connected. This determination is based on the amplitude or the power level of the amplitude modulated signal (i.e. a signal with varying amplitude) to be amplified. The amplitude modulated signal is amplified with the determined amplifier segment(s) and a dynamically modulated load is then applied on the amplified signal to enable increased utilization of the amplifier segments.

Figure 4:
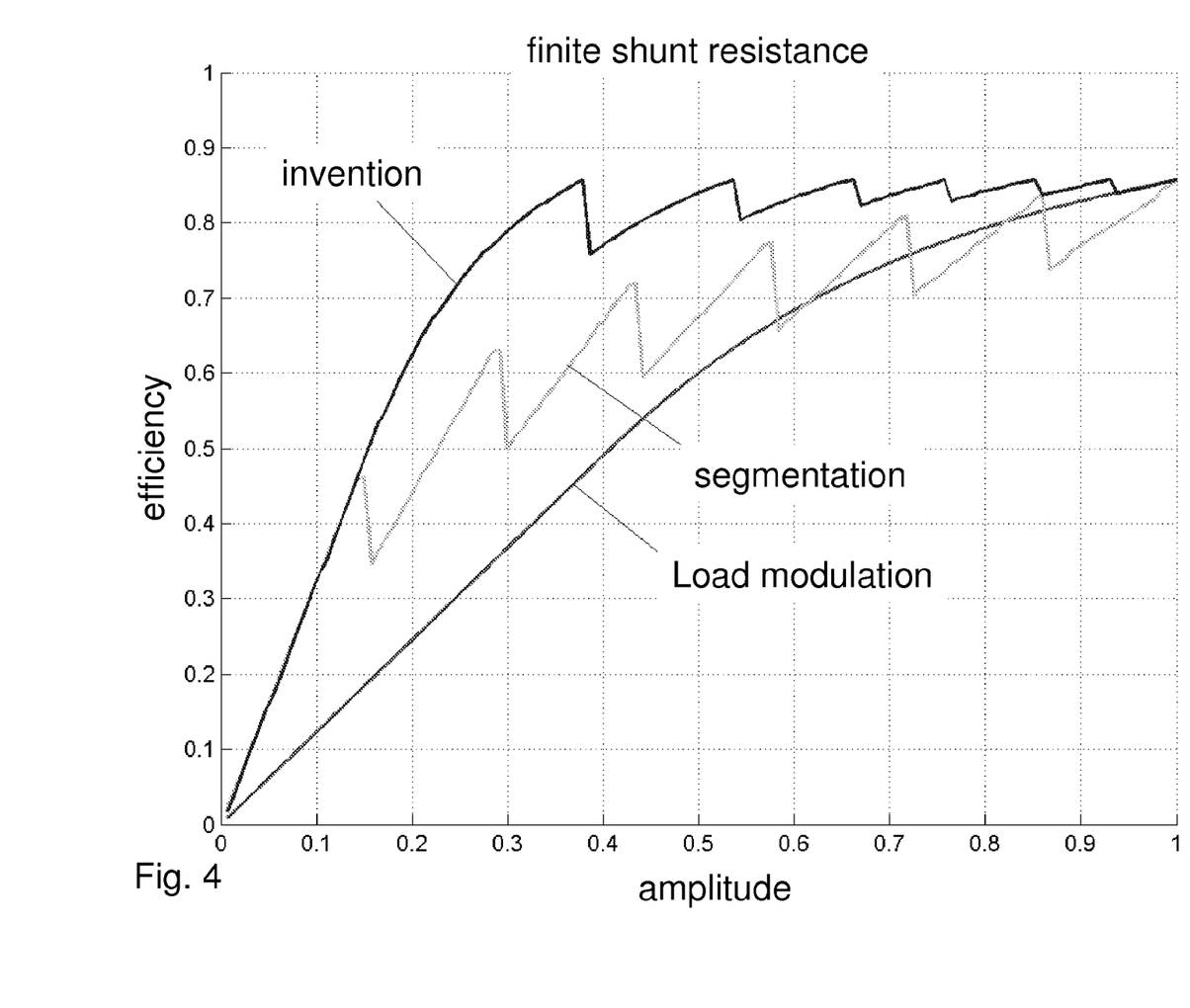
FIG. 4 shows the efficiency curve of the invention compared to prior art methods.

An efficiency curve of the invention, together with that of a prior art segmented amplifier with quarter-wave lines and a prior art load modulation amplifier, is shown in FIG. 4. From FIG. 4 it can be seen that by adding more and smaller segments the efficiency will in this case approach a constant high efficiency across all output levels.

Thus, FIG. 4 shows, surprisingly, that the efficiency at low and medium output amplitudes is very high with embodiments of the invention, even though it is built upon two prior art methods that both suffer heavily from shunt loss in this region.

Figure 5A:
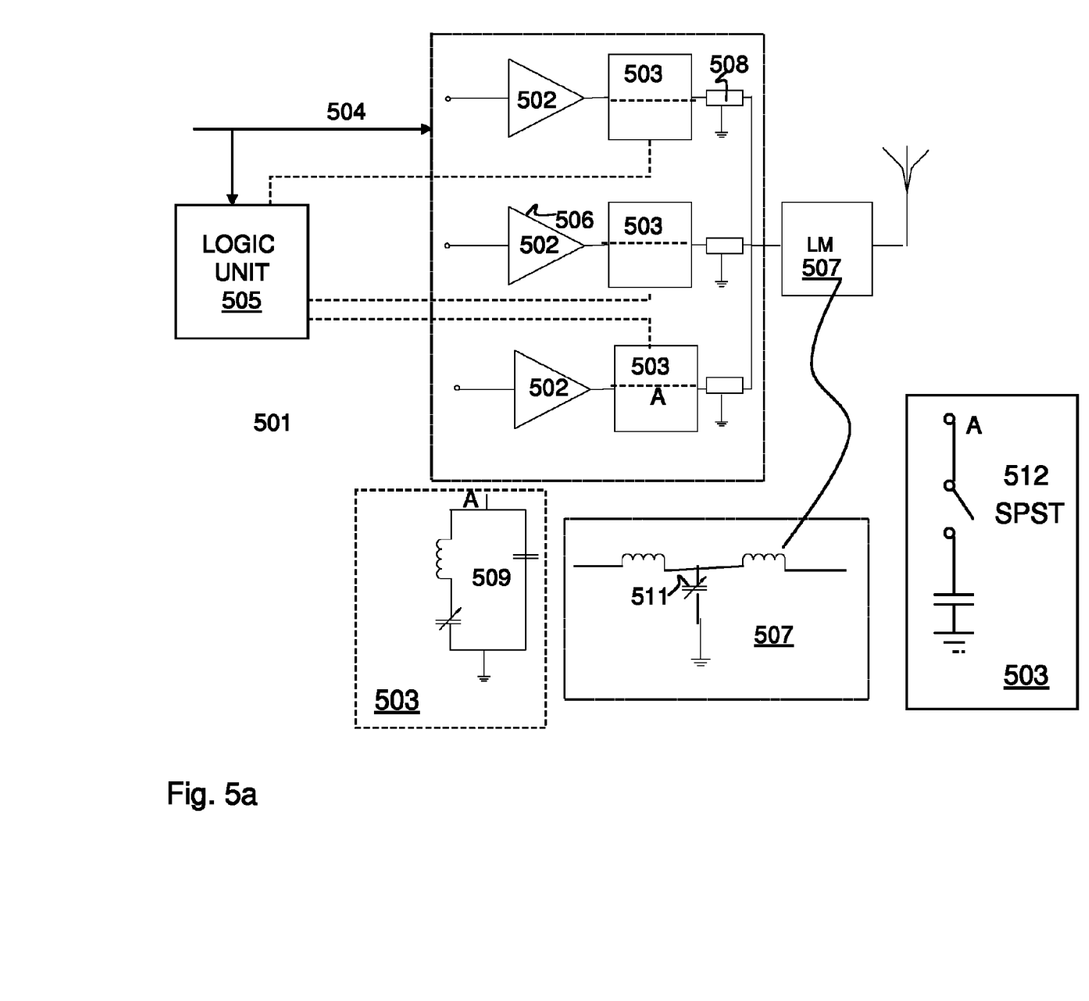
FIG. 5a illustrates a segmented amplifier with quarter-wave lines according to embodiments of the present invention.

A schematic of a binary-weighted segmented amplifier circuit 501 with three segments 502 with dynamically modulated load 503 and dynamically tuned circuits 502 for coupling amplifier segments into the circuit with quarter-wave lines is shown in FIG. 5a. The amplifier circuit 501 for amplifying an amplitude modulated signal 504 comprises a plurality of segmented amplifiers 502 and connectors 503 for interconnecting the plurality of segmented amplifiers 502 to be used for amplifying the amplitude modulated signal 504. The amplifier circuit further comprises a logic unit 505 for determining at least one amplifier 506 of the plurality of segmented amplifiers 502 to be used for amplifying the amplitude modulated signal 504. The logic unit 505 receives amplitude or power level of the signal to be amplified and outputs control signals to the network elements (e.g. switches or controlled capacitors) controlling connection or disconnection of the amplifier segments. As stated above, the reduced loss is accomplished by combining a segmented amplifier with load modulation, therefore the amplifier circuit comprises a load 507 connected to the plurality of segmented amplifiers 502. The load is configured to be applied to the amplified signal and to be dynamically modulated based on the amplitude of the amplified signal 504 to enable increased utilization of the determined amplifiers.

The connectors may comprise dynamically tuning circuits 509 or switches 512, e.g. SPSTs. As illustrated in FIG. 5a, the dynamically tuned circuits may be dynamically controlled resonators, adapted to alternate between an open circuit and a closed circuit. Moreover, the passive elements may be a switch (e.g. a SPST) 512 positioned between the plurality of amplifier segments to connect the determined amplifier segment(s). The switch may be adapted to alternate between an open circuit where an amplifier segment is connected and a closed position where the amplifier segment is disconnected.

Figure 7:
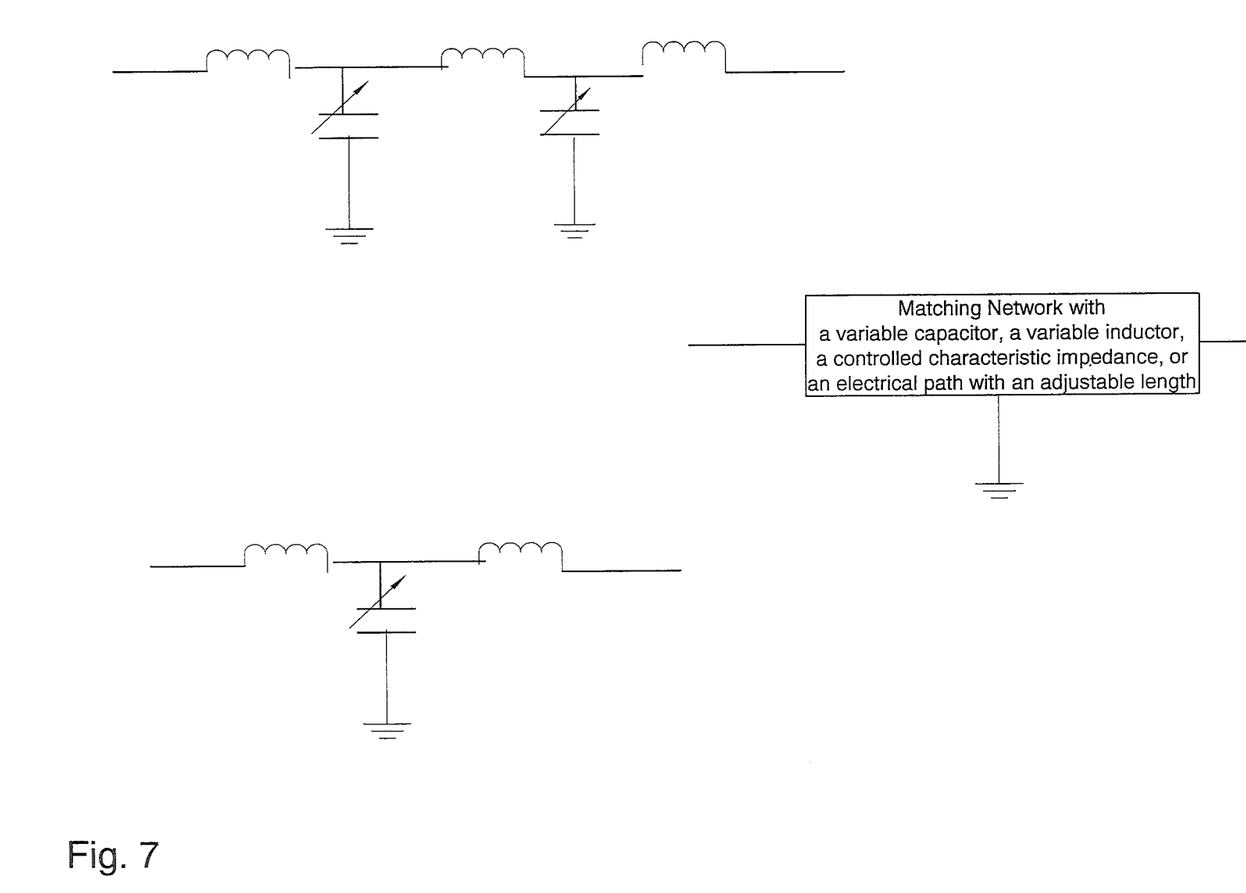
FIG. 7 exemplifies Load Modulation (LM) which can be used in the segmented amplifier of FIG. 6.

Furthermore, the load 507 may be a variable matching network with one or more controlled elements such as variable capacitors 511 connected to a load such as an antenna as illustrated in FIGS. 5a and 7. Other examples of controlled elements used in the matching network are variable inductors, and controlled characteristic impedance.

Figure 6:
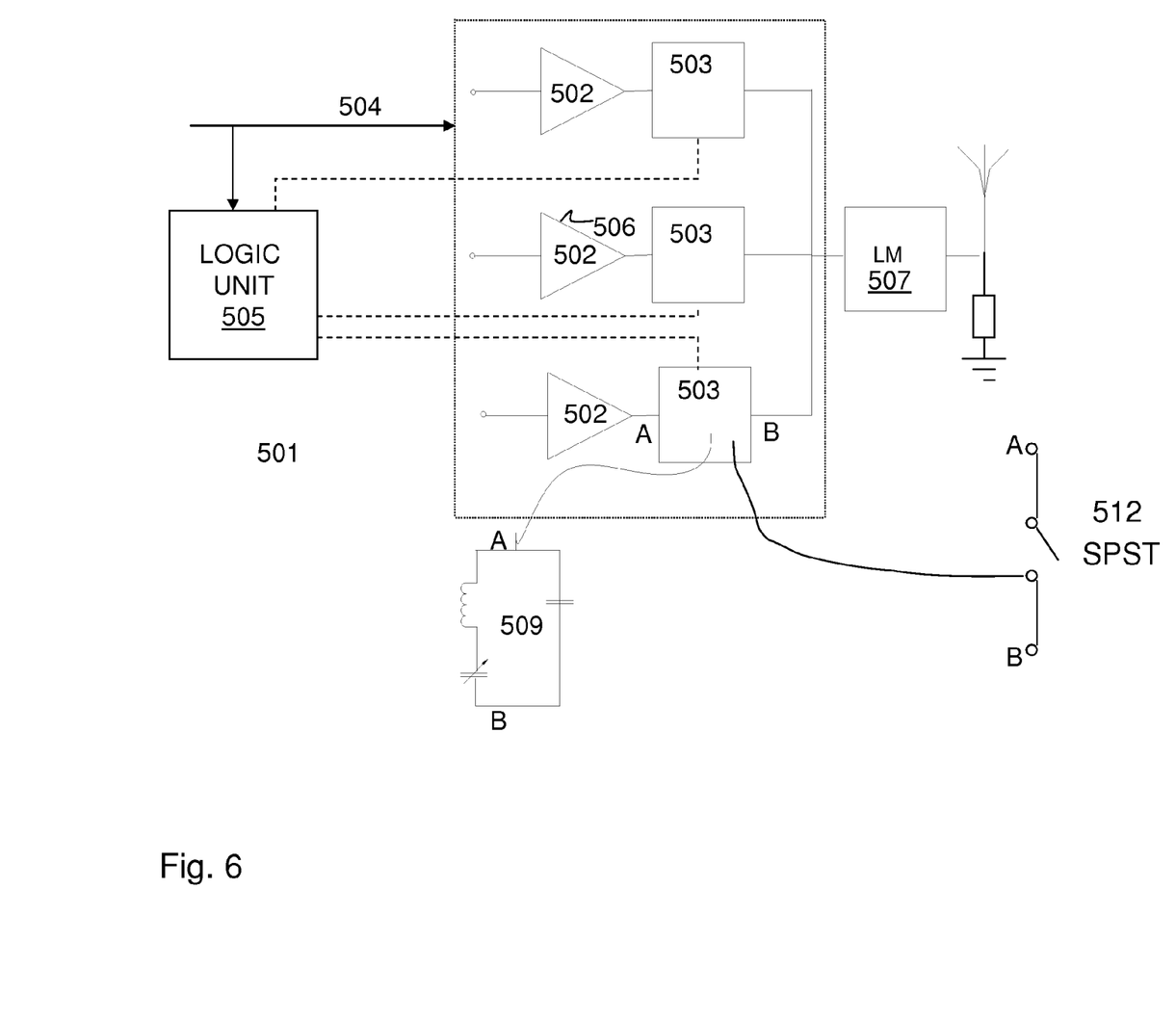
FIG. 6 illustrates a segmented amplifier without quarter-wave lines according to embodiments of the present invention.

A schematic of a binary-weighted segmented amplifier circuit 501 with three segments 502 with dynamically modulated load 503 and dynamically tuned circuits 502 for coupling amplifier segments into the circuit without quarter-wave lines is shown in FIG. 6. The dynamically tuned circuits 509 may be dynamically controlled resonators, adapted to alternate between an open circuit and a closed circuit. Moreover, the passive elements may be a switch (e.g. a SPST) 512 positioned between the plurality of amplifier segments to connect the determined amplifier segment(s). The switch may be adapted to alternate between an open circuit where an amplifier segment is disconnected and a closed position where the amplifier segment is connected.

Figure 5B:
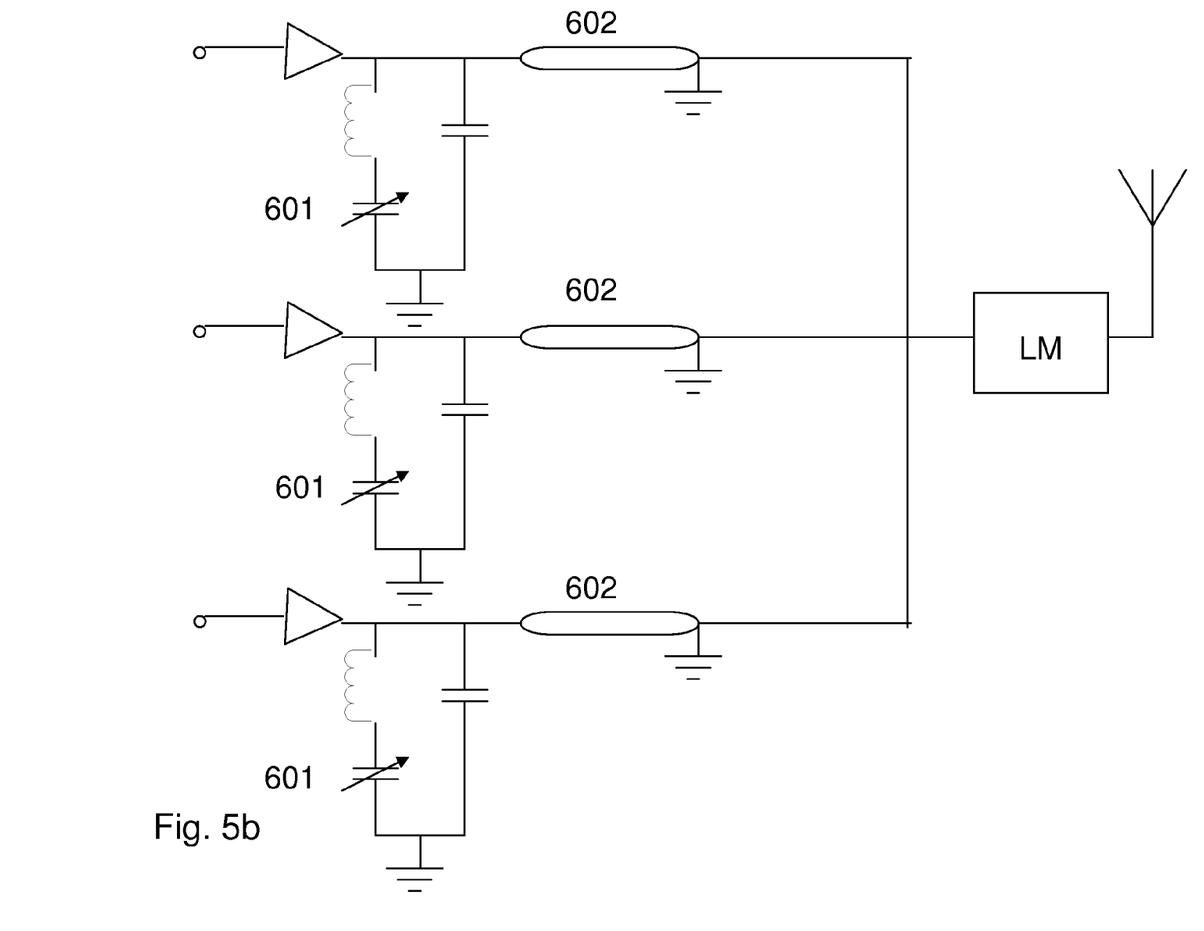
FIG. 5b illustrates a binary weighted segmented amplifier with dynamically tuned coupling, quarter wave lines and modulated load according to an embodiment of the present invention.

In the embodiment disclosed in FIG. 5a, the same type of components (variably tuned circuits) are used both for the dynamic load matching and switching of amplifier segments. Otherwise a switch (e.g. an SPST (Single Pole Single Throw)) plus some passive components such as switches, transistors, MEMS, relays can be used instead of the variably tuned circuit. FIG. 5b illustrates an embodiment with binary weighted segmented amplifiers where variably tuned capacitors are used for both the dynamic load matching and the switching of amplifier segments.

The dynamically (variably) tuned circuits (e.g., the capacitors 601 in FIG. 5b) at the amplifier outputs work by providing a RF closed circuit to ground for inactive segments, and acting as open circuits for active segments. For inactive segments, the variable capacitor 601 is tuned so that the series resonator provides a closed circuit to ground for the RF. By this, the amplifier segment is made inactive and should also not be driven, while the quarter-wave line 602 transforms the closed circuit into an open circuit at the other end, the input of the load modulator. For active segments, the left capacitor 601 is tuned so that the series resonance is at a frequency other than the RF, and the circuit provides a parallel resonance (or whatever impedance the operation class of the amplifier segments call for) at RF. The means for applying the load modulation may for example be implemented as shown in FIG. 7 with matching networks with one and two controlled elements (variable capacitors). Examples of other controlled elements are variable inductors, controlled characteristic impedance and controlled electrical length.

More controlled variable elements generally give wider range of matching and better load matching (less residual reactance).

Figure 8:
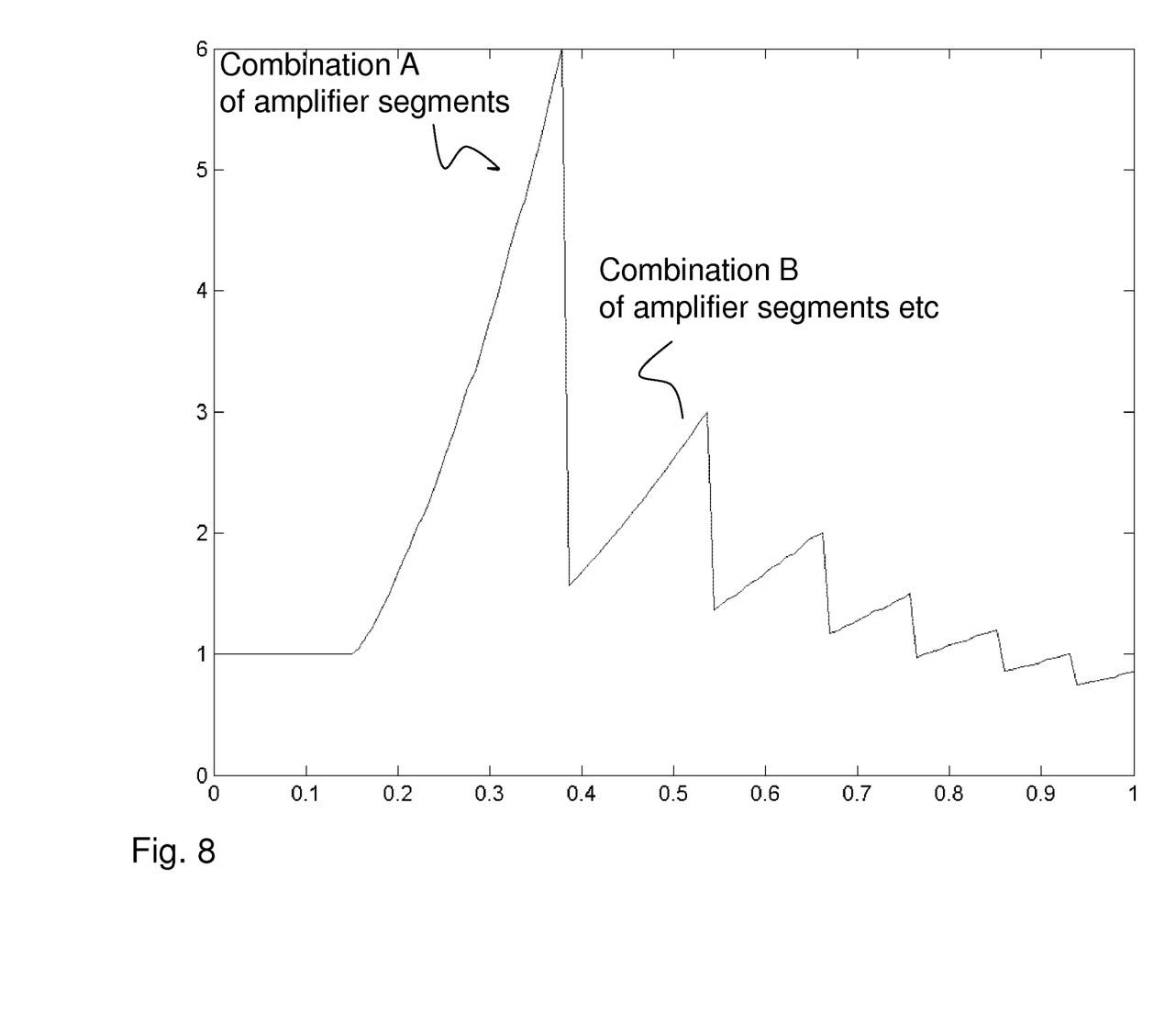
FIG. 8 shows dynamically matched load resistance of an example amplifier according to an embodiment of the present invention with different combinations of amplifier segments.

The dynamically modulated load resistance (looking into the load modulator from the left) vs. output amplitude for the example amplifier is shown in FIG. 8.

Figure 9:
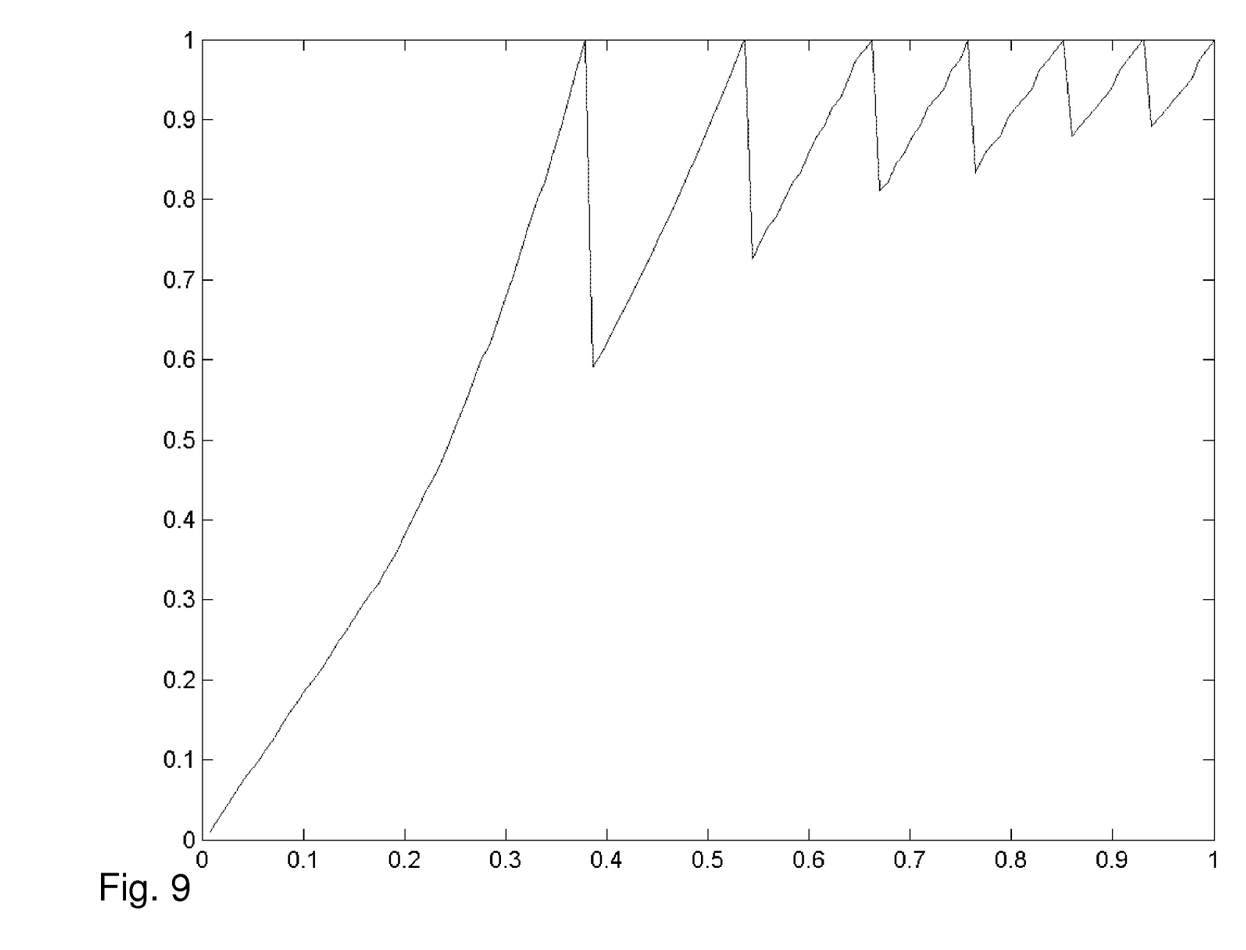
FIG. 9 shows the level-normalized output RF current vs. output amplitude according to an embodiment of the present invention.

The total output RF current vs. output amplitude, normalized to the maximum output current of the combination of amplifier segments in use at each level, is shown in FIG. 9. The output RF current for each combination of segments is in this example used to the maximum before a new combination sets in for increasing amplitude. This is also reflected in the RF drive voltage at the input side of the amplifier segments (transistors), since the output current is controlled by the input voltage.

The amplitude points where switching between different configurations of amplifier segments take place thus change with the application of load modulation. The load modulation lowers the load resistance at the active transistor outputs in the upper range of each segment combination, which therefore can be used to output higher power.

Figure 10:
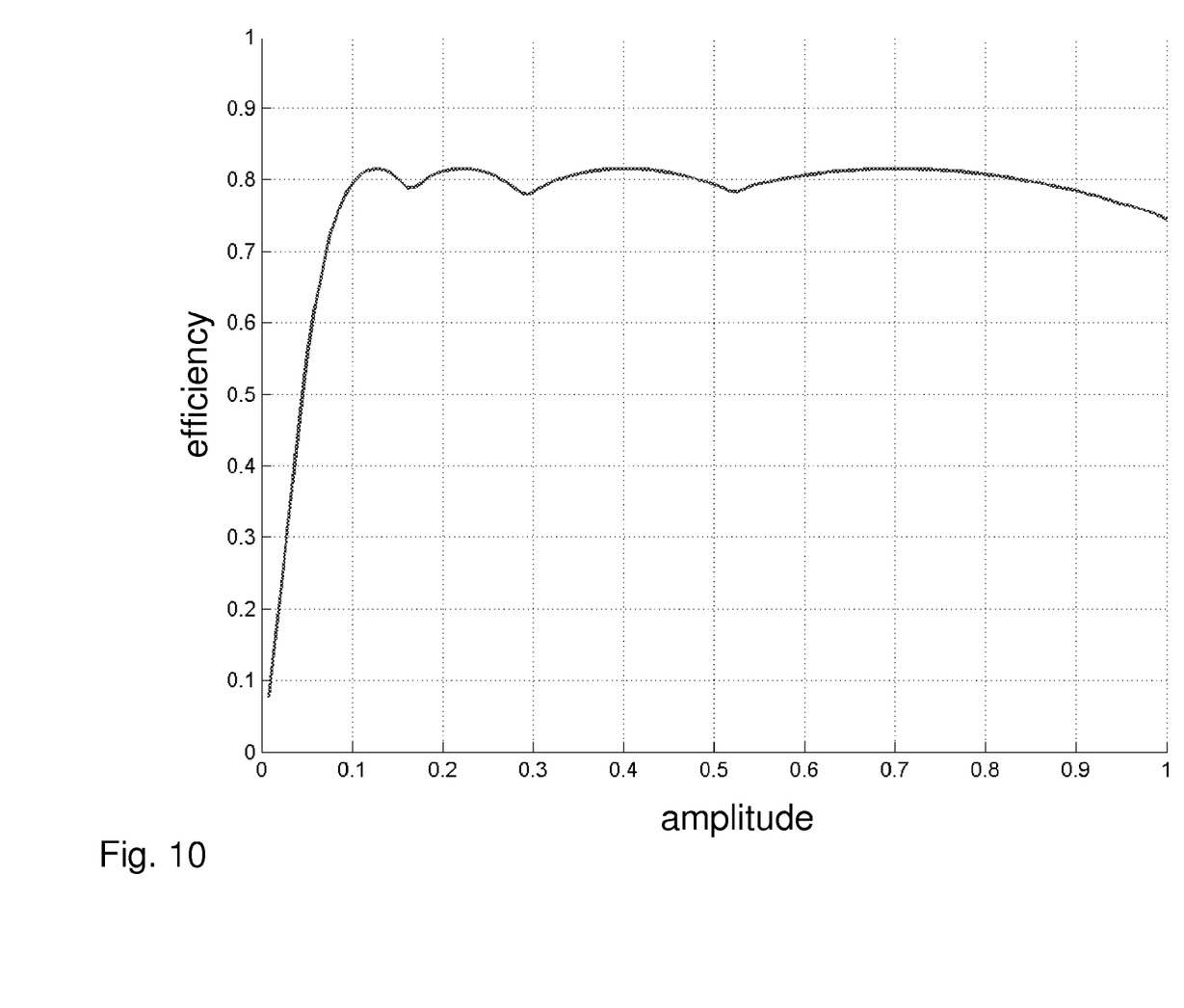
FIG. 10 illustrates the efficiency of an embodiment of the invention, for a 4-segment amplifier.

Another embodiment has four amplifier segments which are used only in the combinations 1 amplifier segment (AS), 1 AS+2 ASs, 1 AS+2 ASs+3 ASs, 1 AS+2 ASs+3 ASs+4 ASs. The combinations are approximately exponentially scaled. The transistor technology in the example has lower shunt loss but higher Rds loss (drain-source resistance in the "triode region"). The efficiency curve of the amplifier with four amplifier segments is shown in FIG. 10.

Figure 11:
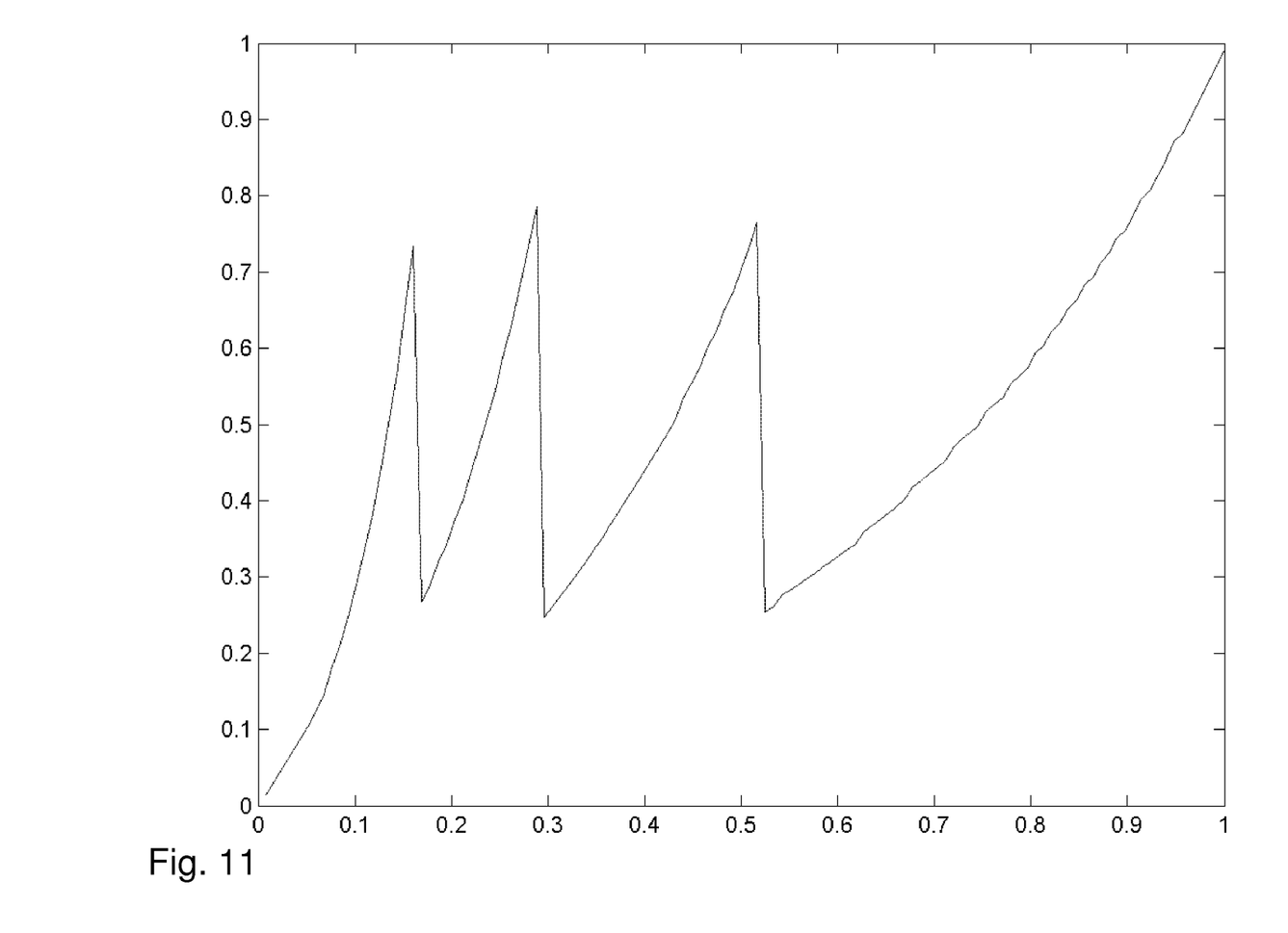
FIG. 11 shows the level-normalized output RF current vs. output amplitude according to an embodiment of the present invention.

The total output RF current vs. output amplitude, normalized to the maximum output current of the combination of amplifier segments in use at each level, is shown in FIG. 11. Contrary to the previous example it is here more efficient to not go all the way up to maximum output for the lower segment combinations.

According to embodiments of the present invention, quarter-wave lines from the amplifier segments may be used. Using the quarter-wave lines from the amplifier segments has an advantage in that the load modulator's tuning range is approximately the same for all combinations of segments. An alternative is to use simple paralleling of segments. The switches or variably tuned circuits are then placed so they connect the amplifier segments' outputs with the input of the load modulator when active and disconnect them when inactive.

The above described examples have dealt with fully dynamical amplifier segmentation. In case the segment switching or tuning is not fast enough, embodiments of the invention can be used in a slower mode, slower than what is required by the amplitude variations. Some output power (segment size) overhead is then required.

A common input RF signal to all active amplifier segments is possible with the example systems. In practice, driving active elements with individually optimized signals may increase efficiency. The inactive segments should have low, or preferably no, RF drive.

Using more than one load modulator (for example one per segment) is possible and could bring some efficiency benefit. The increase in complexity may however be better spent in using more tuned elements in a single load modulator. Another alternative is to use the dynamically tuned circuits at the amplifier outputs, which can to some extent be used for "load modulation per segment" functions. In the case of more than one load modulator, the output current of "lower" segments could be made constant above an amplitude point, gradually increasing with amplitude above some point, or some other function that decreases the jaggedness of the signals involved.

Figure 12:
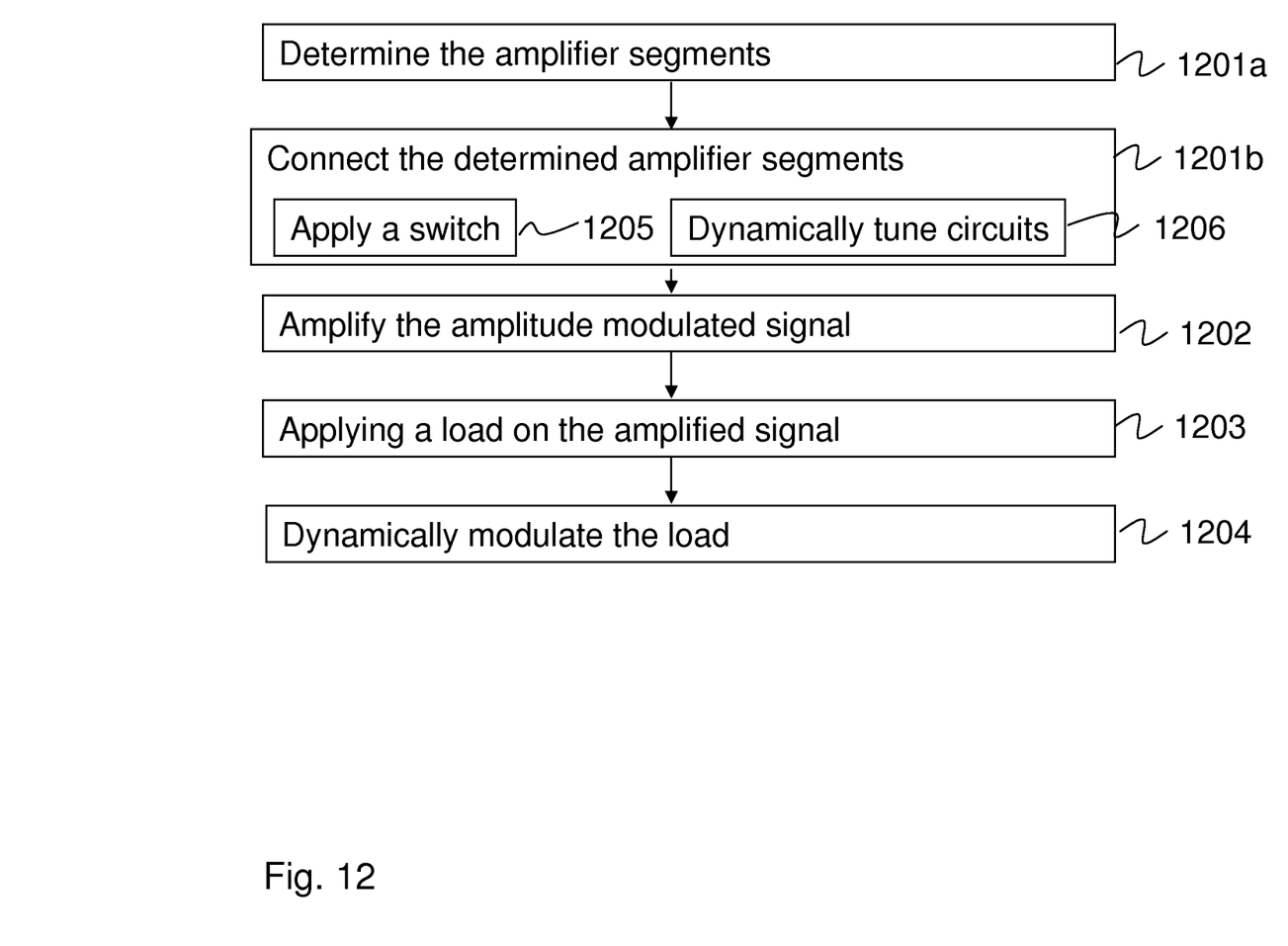
FIG. 12 is a flowchart of a method according to embodiments of the present invention.

Turning now to FIG. 12 which illustrates a flowchart of the method according to embodiments of the present invention. In the method, a number amplifier of segments is determined, i.e. at least one amplifier segment, 1201a to be used for amplifying the signals with varying amplitude based on the amplitude of the signal to be amplified such that substantial optimal amplifier efficiency is achieved. Accordingly, the signal is amplified 1202 by using the determined amplifier segments. A load on the amplified signal is applied 1203 according to the invention and the load is dynamically modulated 1204 based on the amplitude of the amplified signal to enable increased utilization of the amplifier segments implying increased output voltage or current of the amplifier segments.

According to one embodiment, the determined amplifier segment(s) is (are) connected (i.e. activated) 1201b by dynamically tuning 1205 circuits of the plurality of segmented amplifiers. An example of such tuned circuits is dynamically controlled resonators, alternating between an open circuit and a closed circuit.

According to a further embodiment, the determined amplifier segment(s) is (are) connected (i.e. activated) 1201b by applying 1206a switch between the plurality of amplifier segments. The switch may be alternated between an open circuit where an amplifier segment is connected and a closed position where the amplifier segment is disconnected or between an open circuit where an amplifier segment is disconnected and a closed position where the amplifier segment is connected.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A method for amplifying a signal with varying amplitude, comprising the steps of:
    determining at least one amplifier segment of a plurality of amplifier segments to be used for amplifying the signal with varying amplitude based on the amplitude of the signal to be amplified such that substantial optimal amplifier efficiency is achieved;
    amplifying the signal by using the determined amplifier segments to generate an amplified signal;
    applying a load on the amplified signal;
    dynamically modulating the load based on the amplitude of the amplified signal; and
    handling the connection of the determined amplifier segment(s) by dynamically tuning circuits,
    wherein the dynamically tuned circuits are dynamically controlled resonators that alternate between an open circuit and a closed circuit.

2. The method according to claim 1, wherein the amplifier segments are connected to an output by quarter-wave lines.

3. The method according to claim 2, wherein the method comprises the further step of:
    connecting the determined at least one amplifier segment by controlling at least one switch connected between the plurality of amplifier segments to alternate between an open circuit where the respective amplifier segments are connected and a closed position where the respective amplifier segments are disconnected.

4. The method according to claim 1, wherein the method comprises the further step of:
    connecting the determined at least one amplifier segment by controlling at least one switch connected between the plurality of amplifier segments to alternate between an open circuit where the respective amplifier segments are disconnected and a closed position where the respective amplifier segments are connected.

5. The method according to claim 1 wherein the load is a matching network comprising a controlled element, and the step of dynamically modulating the load based on the amplitude of the amplified signal comprises tuning the controlled element.

6. The method according to claim 5, wherein the controlled element comprises a variable capacitor, and the step of dynamically modulating the load based on the amplitude of the amplified signal comprises tuning the variable capacitor.

7. The method according to claim 5, wherein the controlled element comprises a variable inductor, and the step of dynamically modulating the load based on the amplitude of the amplified signal comprises tuning the variable inductor.

8. The method according to claim 5, wherein the controlled element comprises a controlled characteristic impedance, and the step of dynamically modulating the load based on the amplitude of the amplified signal comprises tuning the controlled characteristic impedance.

9. The method according to claim 1, wherein the amplifier segments comprise binary weighted amplifier segments.

10. A method for amplifying a signal with varying amplitude, comprising the steps of:
    determining at least one amplifier segment of a plurality of amplifier segments to be used for amplifying the signal with varying amplitude based on the amplitude of the signal to be amplified such that substantial optimal amplifier efficiency is achieved;
    amplifying the signal by using the determined amplifier segments to generate an amplified signal;
    applying a load on the amplified signal;
    dynamically modulating the load based on the amplitude of the amplified signal; and
    handling the connection of the determined amplifier segment(s) by dynamically tuning circuits,
    wherein the load is a matching network comprising a controlled element, and the step of dynamically modulating the load based on the amplitude of the amplified signal comprises tuning the controlled element, and
    wherein the controlled element comprises an electrical path with an adjustable length, and the step of dynamically modulating the load based on the amplitude of the amplified signal comprises adjusting the length of the electrical path.

11. An amplifier circuit for amplifying a signal with varying amplitude, the amplifier circuit comprising:
    a plurality of amplifier segments;
    connectors that controllably interconnect selected ones of the plurality of amplifier segments to be used for amplifying the signal with varying amplitude;
    a logic unit configured to select at least one amplifier segment of the plurality of amplifier segments to be used for amplifying the signal based on the amplitude or power level of the signal to generate an amplified signal; and a load applied on the amplified signal connected to the selected at least one amplifier segment, wherein the load is configured to be dynamically modulated based on the amplitude of the signal and wherein the connectors comprise dynamically tuned circuits that are controlled to connect the selected at least one amplifier segment, and wherein the dynamically tuned circuits are dynamically controlled resonators that are adapted to alternate between an open circuit and a closed circuit.

12. The amplifier circuit according to claim 11, wherein the amplifier segments are connected to an output by quarter-wave lines.

13. The amplifier circuit according to claim 11, wherein the connectors comprise at least one switch connected between the plurality of amplifier segments to connect the selected at least one amplifier segment, and wherein the switch is adapted to alternate between an open circuit where the respective amplifier segments are connected and a closed position where the respective amplifier segments are disconnected.

14. The amplifier circuit according to claim 11, wherein the connectors comprise at least one switch connected between the plurality of amplifier segments to connect the selected at least one amplifier segment, and wherein the switch is adapted to alternate between an open circuit where the respective amplifier segments are disconnected and a closed position where the respective amplifier segments are connected.

15. The amplifier circuit according to claim 11, wherein the load is a matching network comprising a controlled element and the dynamic modulation of the load based on the amplitude of the amplified signal comprises tuning the controlled element.

16. The amplifier circuit according to claim 15, wherein the controlled element comprises a variable capacitor, and the dynamic modulation of the load based on the amplitude of the amplified signal comprises tuning the variable capacitor.

17. The amplifier circuit according to claim 15, wherein the controlled element comprises a variable inductor, and the dynamic modulation of the load based on the amplitude of the amplified signal comprises tuning the variable inductor.

18. The amplifier circuit according to claim 15, wherein the controlled element comprises a controlled characteristic impedance, and the dynamic modulation of the load based on the amplitude of the amplified signal comprises tuning the controlled characteristic impedance.

19. The amplifier circuit according to claim 11, wherein the amplifier segments comprise binary weighted amplifier segments.

20. An amplifier circuit for amplifying a signal with varying amplitude, the amplifier circuit comprising:

a plurality of amplifier segments;

connectors that controllably interconnect selected ones of the plurality of amplifier segments be used for amplifying varying amplitude;

a logic unit configured to select at least one amplifier segment of the plurality of amplifier segments to be used for amplifying the signal based on the amplitude power level of the signal to generate an amplified signal; and a load applied on the amplified signal connected to the selected at least one amplifier segment, wherein the load is configured to be dynamically modulated based on the amplitude of the signal and wherein the connectors comprise dynamically tuned circuits that are controlled to connect the selected at least one amplifier segment, wherein the load is a matching network comprising a controlled element and the dynamic modulation of the load based on the amplitude of the amplified signal comprises tuning the controlled element, and wherein the controlled element is comprises an electrical path with an adjustable length, and the dynamic modulation of the load based on the amplitude of the amplified signal comprises adjusting the length of the electrical path.

* * * * *

UNITED STATES PATENT AND TRADEMARK OFFICE
CERTIFICATE OF CORRECTION

PATENT NO. : 8,653,887 B2
APPLICATION NO. : 13/388536
DATED : February 18, 2014
INVENTOR(S) : Hellberg Page 1 of 1

It is certified that error appears in the above-identified patent and that said Letters Patent is hereby corrected as shown below:

In the Claims

Column 10, Line 16, in Claim 20, delete "segments be" and insert -- segments to be --, therefor.

Column 10, Lines 16-17, in Claim 20, delete "amplifying varying" and insert -- amplifying the signal with varying --, therefor.

Column 10, Line 20, in Claim 20, delete "amplitude power" and insert -- amplitude or power --, therefor.

Column 10, Line 33, in Claim 20, delete "element is comprises" and insert -- element comprises --, therefor.

Signed and Sealed this
Twenty-sixth Day of August, 2014

Michelle K. Lee
*Deputy Director of the United States Patent and Trademark Office*